United States Patent [19]

Poppe et al.

[11] Patent Number: 4,965,248
[45] Date of Patent: Oct. 23, 1990

[54] METHOD OF FABRICATING THIN LAYERS FROM HIGH-TEMPERATURE OXIDE SUPERCONDUCTORS

[75] Inventors: Ulrich Poppe; Jürgen Schubert, both of Cologne; Wilhelm Evers, Jülich, all of Fed. Rep. of Germany

[73] Assignee: Kernforschungsanlage Julich Gesellschaft mit beschrankter Haftung, Julich, Fed. Rep. of Germany

[21] Appl. No.: 310,698

[22] Filed: Feb. 13, 1989

[30] Foreign Application Priority Data

Feb. 18, 1988 [DE] Fed. Rep. of Germany ....... 3805010
Dec. 7, 1988 [EP] European Pat. Off. ....... 88 120397.0

[51] Int. Cl.⁵ ............................................. C23C 14/08
[52] U.S. Cl. .................................. 505/1; 204/192.24; 204/298.07; 204/298.13; 505/731
[58] Field of Search ................... 204/192.24, 298 TC, 204/298 GF; 505/731, 1

[56] References Cited

U.S. PATENT DOCUMENTS 4,842,704  6/1989  Collins et al. ................. 204/192.24

OTHER PUBLICATIONS

G. K. Wehner et al., Appl. Phys. Lett., 52(14), pp. 1187-1189, Apr. 4, 1988.
U. Poppe et al., Solid State Communications, vol. 66, No. 6, pp. 661-665, (1988).

Primary Examiner—G. L. Kaplan
Attorney, Agent, or Firm—Herbert Dubno

[57] ABSTRACT

A method and apparatus for producing thin superconductor film of high temperature oxide type ceramic superconductors by cathodic sputtering and in which the highest possible oxygen partial pressure is utilized in the space between the cathode and the substrate. Ionizing radiation can be introduced into the space as well.

16 Claims, 6 Drawing Sheets

METHOD OF FABRICATING THIN LAYERS FROM HIGH-TEMPERATURE OXIDE SUPERCONDUCTORS

FIELD OF THE INVENTION

Our present invention relates to a method of fabricating thin layers from high-temperature oxide superconductors and, more particularly, to a method of making improved high-temperature (critical temperature greater than 77 degrees K) superconductive oxide bodies.

The invention also relates to an apparatus for carrying out the method.

BACKGROUND OF THE INVENTION

It is known to provide a method for producing thin layers from the material of an oxidic high-temperature superconductor by constituting the material as a target or cathode material and to utilize a cathodic atomization to deposit the layers on a heated substrate while the ionized gas forming the glow discharge contains oxygen.

A process of this type is used for producing thin layers from superconductive oxide ceramics in accordance with Appl. Phys. Lett., Vol. 51 No. 9, 31 August 1987, to produce superconducting Y-Ba-Cu-O oxide films by sputtering.

It has been found, in this connection, that to generate the desired superconductive characteristic in the layers which are formed, the layer or film must be subjected to an after-treatment (tempering or annealing) in an oxygen atmosphere at temperatures in the range of 800° C. to 900° C.

Not only do these after-treatment steps significantly increase the cost of the fabrication operation but can have other drawbacks as well. For example, because the substrate temperatures are raised above minimum levels, undesired chemical reactions can be promoted between the substrate and the superconductive layer, limiting the scope of application of the method.

OBJECT OF THE INVENTION

It is, therefore, the principal object of the present invention to provide a method or process which extends the principles described to fields in which an after-tempering or annealing in an oxygen atmosphere is not required, thereby reducing the cost of the process, increasing energy efficiency and output, and eliminating chemical reactions between the substrate and the thin layer or film which has been deposited thereon and which otherwise might occur when annealing was required.

It is another object of this invention to provide an improved apparatus for making such films or thin layers of superconductive oxide ceramics and especially ceramics having superconductive properties at or above the boiling point of liquid nitrogen.

SUMMARY OF THE INVENTION

These objects and others are attained in accordance with the present invention in a method of fabricating a thin layer from an oxide high-temperature superconductor which comprises the steps of:

(a) heating a substrate;

(b) juxtaposing a cathodically poled target composed of a high-temperature oxide superconductor with the substrate;

(c) providing an atmosphere ionized by glow discharge around the substrate and the target;

(d) effecting cathodic atomization of the target and deposition of cathodically atomized material from the target onto the heated substrate in the presence of the atmosphere to form a thin-layer superconductor body on the substrate; and (e) maintaining a maximum partial pressure of oxygen in the atmosphere sustaining reactive cathodic deposition of the high-temperature oxide superconductor on the substrate.

In apparatus terms the invention comprises:
means for heating a substrate;
a cathodically poled target composed of a high-temperature oxide superconductor juxtaposed with said substrate and spaced therefrom by a distance of 5 to 20 mm;
means for providing an atmosphere ionized by glow discharge around said substrate and said target;
means for effecting cathodic atomization of said target and deposition of cathodically atomized material from said target onto the heated substrate in the presence of said atmosphere to form a thin-layer superconductor body on said substrate; and
means for maintaining a maximum partial pressure of oxygen in said atmosphere sustaining reactive cathodic deposition of said high-temperature oxide superconductor on said substrate.

According to the invention, the cathodic sputtering or atomization of the target material onto the substrate is effected at the highest possible partial pressure of oxygen which can support a reactive cathodic sputtering layer formation.

As a consequence, during the glow-discharge and during the formation of the layer, the material which is to form the layer or forming the layer is subjected to an enrichment with oxygen. This can be achieved even with temperatures as low as 450° C. at the substrate and is effected at substrate temperatures between 450° C. and about 770° C. in the production of layers with superconductive characteristics so that the annealing or tempering step in an oxygen atmosphere following layer formation can be omitted entirely.

The upper limit of the oxygen partial pressure is determined by the oxygen partial pressure at which a self-sustaining $O_2$-plasma discharge is stabilized. At a higher partial pressure of oxygen, the self-sustaining oxygen-plasma discharge will be quenched or rendered unstable. The oxygen partial pressure should be at least 0.5 Torr (corresponding to 67 Pa) and preferably is about 5 Torr or higher.

We may make use of an oxygen-rich gas mixture, preferably a gas mixture which contains a predominant proportion of oxygen or ozone and preferably pure oxygen or an oxygen/ozone mixture.

One of the advantages of operation in accordance with the present invention is that apart from an enrichment of the layer forming material with oxygen, there is a reduction in the tendency toward oxygen loss from the target.

According to a preferred embodiment of the invention to increase the oxygen partial pressure at the substrate, the latter is flushed with oxygen or ozone during the cathode sputtering deposition of the superconductive oxide ceramic. The flushing can be effected through the use of a capillary system positioned to provide a laminar $O_2$ or $O_3$ flow on and across the surface of the substrate or a flow which is as close to laminar as can be attained.

According to a feature of the invention, the oxygen partial pressure at the substrate is increased by feeding oxygen or ozone into the cathode sputtering zone at the target while pumping the gas near the substrate so that the fed oxygen or ozone will pass in a laminar flow from the target to the substrate. In this arrangement, oxygen, fed not only into the region at which the layer is to be formed, but also in the zone in which ions migrate toward the layer to enrich the ion cloud with oxygen as well. The laminar flow will lead to a higher deposition rate at high oxygen pressures.

According to another feature of the invention which can be used in conjunction with an increase in oxygen partial pressure by any of the modes described, the gas space between the target and the substrate is provided with an ionizing radiation. The ionizing radiation can derive from a strong light source with the light being injected into the gas space continuously or in a pulsed manner.

The source can be a laser. Of course, other sources of ionizing radiation, for example, x-rays, alpha, beta, gamma or other radioactive decay-radiation sources can be used in addition or as an alternative.

According to yet another feature of the invention, microwaves are injected between the cathode material and the substrate into the gas space as ionizing radiation. The injection of microwaves has been found to effect a very high degree of ionization in the plasma so that it is possible to maintain a self-sustaining discharge in the plasma even at very high oxygen partial pressures, say 200 Torr or $1.7 \times 10^4$ Pa. It appears that the injection of microwaves into the plasma may liberate ultraviolet light which can contribute to the phenomenon and the self-sustaining discharge.

According to another feature of the invention, the surface of the substrate is treated with hard ultraviolet radiation. We have found, most surprisingly, that the application of this nonthermal energy to the substrate appears to provide a surface effect which promotes the layer growth on the substrate and within the layer. Furthermore, the ozone which is produced because of the presence of the hard ultraviolet radiation is highly reactive. It may decompose upon the heated substrate and thus can contribute energy to the layer in formation which enables the temperature of the substrate to be held comparatively lower than that which is required when the hard ultraviolet radiation is not used.

The apparatus of the invention includes a cathode which is surrounded by an insulator which can be provided between the cathode and a shield likewise surrounding the cathodes.

The distance between the cathode material and the substrate should be substantially 5 to 20 mm. This ensures that there will not be a breakdown between the cathode material and the shield which can occur at high gas pressures. The distance between the cathode material and the substrate ensures an especially short free path length and allows operation at high gas pressures.

According to a feature of the invention, means is provided for introducing ionizing radiation between the cathode material and the substrate, i.e. into the gas space between them. This device can include a microwave source or a source of hard ultraviolet light for irradiating the surface substrate. A capillary system can be provided as described for flushing the space and substrate surface with oxygen or ozone. A laminar gas flow of oxygen or ozone from the target towards the substrate will enhance the deposition rate of sputtered material on the substrate.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
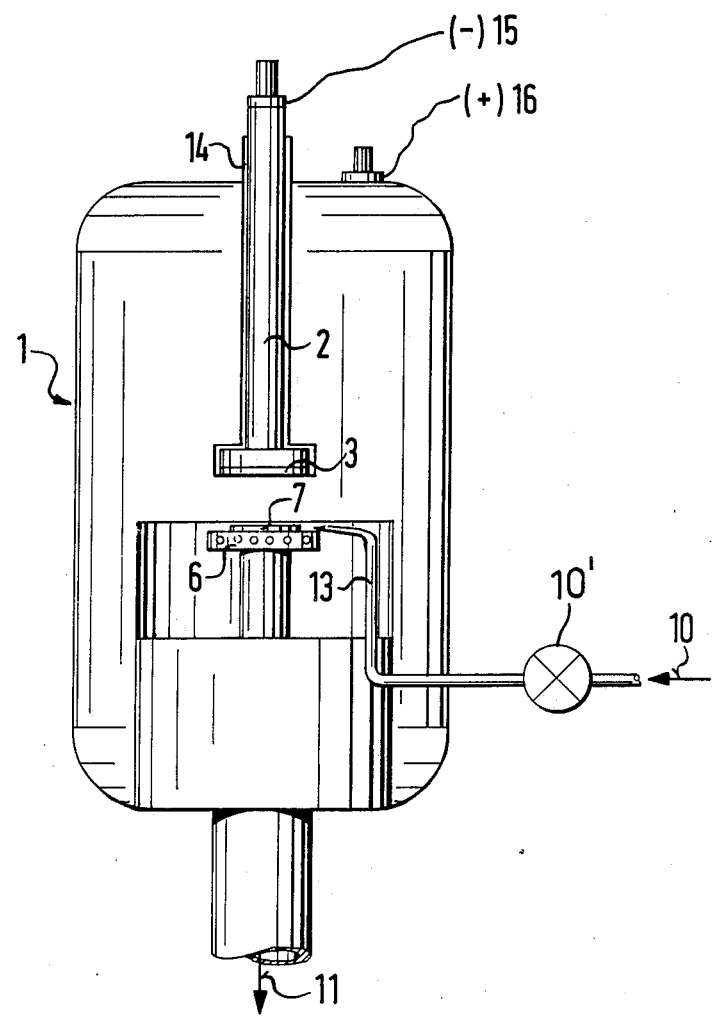
FIG. 1 is a diagrammatic sectional view of an apparatus for carrying out the process of the invention.

As can be seen from FIG. 1, a hermetically sealed chamber 1 has a copper cathode 2 extending into it from above and sealed with respect to the chamber.

The lower end of the cathode 2 is provided with the target 3 of cathode material, e.g. the 1, 2, 3 superconductor previously described.

Figure 2:
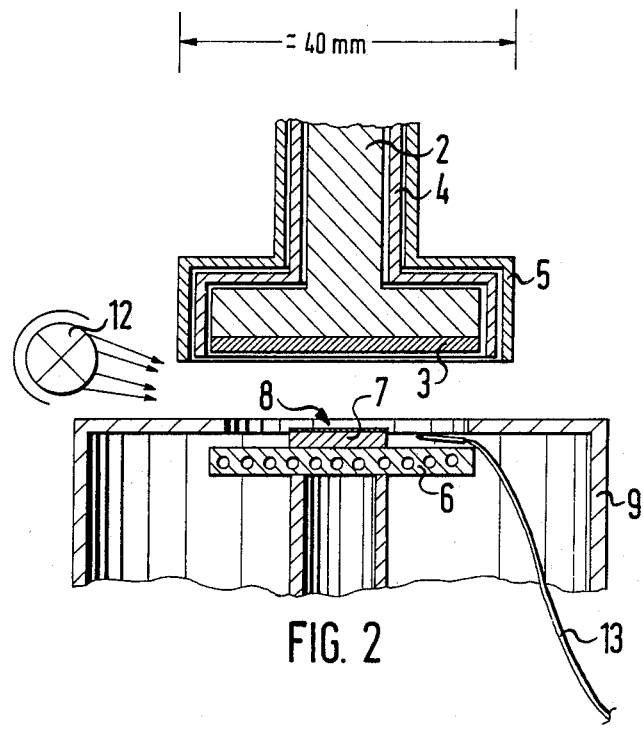
FIG. 2 is a cross-sectional view showing the cathode and anode assembly of the apparatus of FIG. 1 provided with an ultraviolet lamp.

The copper cathode 2, as is best seen from FIG. 2, is surrounded by an insulator 4 and a copper shield 5. Means, not shown in the drawing, is provided for cooling the cathode, e.g. by the circulation of water therethrough.

Opposite the target 3 of the cathode, across a gas-filled space, we have provided a heatable substrate holder 6 which can have resistance heaters which have not been illustrated in detail.

The substrate 7 is mounted on a heatable substrate holder 6 and can be heated by conduction therefrom. A layer 8 of the superconductive material is formed by cathode sputtering on the substrate 7.

The substrate holder, in turn, is surrounded by a cooled copper shield or mask 9.

The apparatus is provided with electrical terminals for connection at 15 and 16 to a source of direct current and such that the catho de is at a negative potential while a positive potential can be provided to the housing. The shields 5 and 9 can be at zero potential or ground and this, of course, can correspond to the potential at the positive terminal of the source in the case in which the positive terminal is grounded. The reference numeral 14 has been used to indicate the feed-through of the housing, also not illustrated in detail.

In addition, the apparatus is provided with a gas feed-line 10 which can have a valve 10' therein and a connection 11 to an evacuating pump arrangement. Means is provided as represented at 12 in FIG. 2 for subjecting the gas space between the cathode and the anode to ionizing radiation, e.g. ultraviolet light, microwave or other ionizing radiation, preferably trained on the surface of the substrate 7. The upper surface of the substrate is also flushed with ozone or oxygen by the capillary system represented diagrammatically at 13 connected to the gas feed-line 10.

SPECIFIC EXAMPLES

The following examples utilized a device of the above-described type although with different gases and with or without ultraviolet radiation. The capillary system was provided generally in the region of the substrate but did not necessarily flush the surface of the substrate with the gas.

The oxygen partial pressure during the various experiments amounted to up to 667 Pa (5 Torr) and in the cases discussed below specifically was 333 Pa (2.5 Torr).

To avoid contamination of the sputter gases, the pressure was dynamically set by permitting oxygen to enter through the capillary system in the region of the substrate while a suction pump connected at 11 pumped away gases from the chamber. The pump was a cryopump utilizing a zeolite cooled with liquid nitrogen and a relatively high suction capacity.

The potential applied to the cathode was between 150 and 250 volts and the cathode sputtering current was 50 to 150 mA. Under these conditions, the dark space on the cathode had only a depth of less than 1 mm. The distance between the substrate and the target was 10 mm and the diameter of the circular and plate-shaped target of $YBa_2Cu_3O_7$ was about 35 mm.

EXAMPLE 1

(Pure Oxygen and Ultraviolet Light)

Seven different substrate temperatures were used for the application of layers of $YBa_2Cu_3O_7$ on a substrate of $SrTiO_3$. Thereafter, the resistance value of the deposit in a temperature rangeof room temperature to about 65K was measured, with special attention being given to the region of the greatest resistance drop at about 90K.

Figure 3:
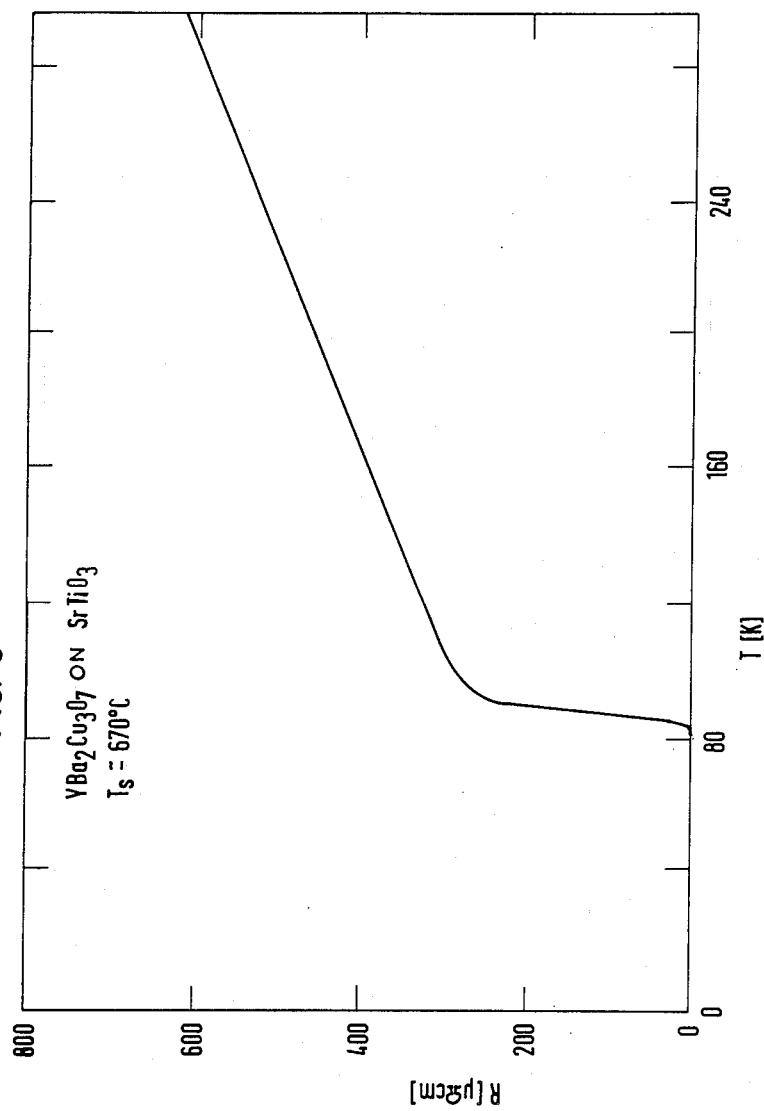
FIG. 3 is a graph of the resistance characteristic of a superconductor layer produced in accordance with Example 1.
Figure 4:
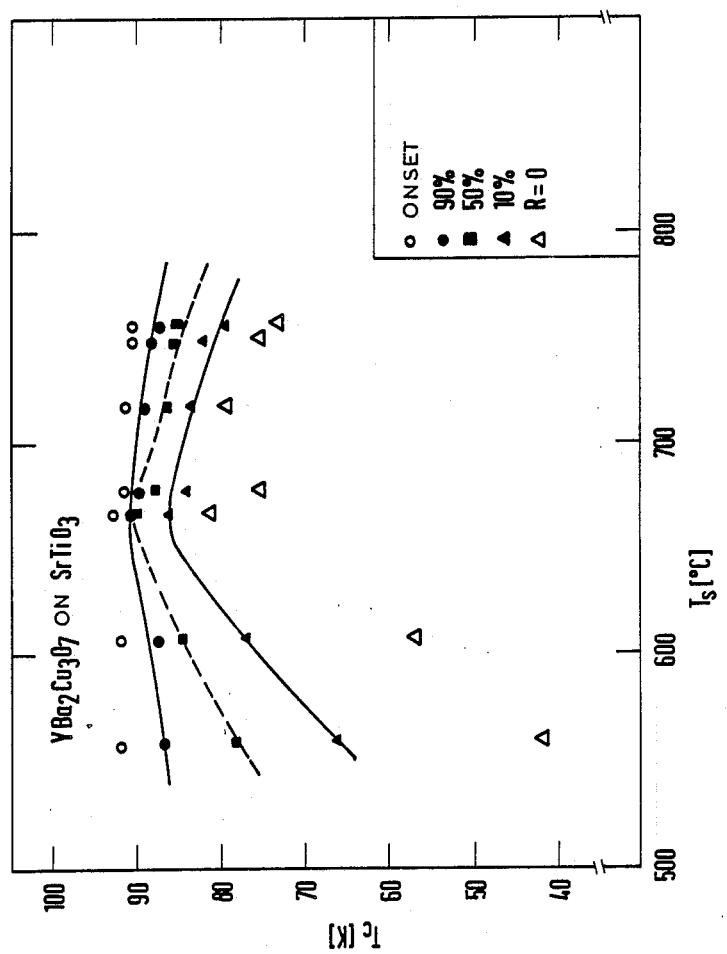
FIG. 4 is a set of graphs showing a series of tests utilizing pure oxygen as the gas and utilizing ionizing radiation.

FIG. 3 shows the resistance curve obtained with a substrate temperature of 670° C. and from this curve it will be apparent that in the region of a critical temperature $T_c$ of about 90K, there is a sharp resistance drop corresponding to superconductivity. In this region, resistance values are reduced from 90% to 50% to 10% and finally to 0 as determined by measurements and as represented in the graph of FIG. 4 for the various curves and in which the rate of drop-off is shown for different substrate temperatures $T_s$.

R in the diagrams, of course, represents the resistance. It will be apparent from these diagrams that even with layers fabricated at low substrate temperatures, the sharp resistance drop-off begins at 91K.

It should be evident further that even at low substrate temperatures for the preparation of the layer, a significant portion of a superconductor phase has been formed with a high jump characteristic temperature and that optimal results can be obtained even below a temperature of 650° C. for the production of layers with high transition temperatures.

Further investigations have shown that all of the layers produced are epitaxial with the c-axis perpendicular to the substrate. The critical current density of the layer fabricated with a substrate temperature of 670° C. is above $10^6$ A/cm$^2$ at 77K.

The fabricated layers are found to have a very smooth upper surface with a surface roughness less than 0.1 micrometer so that there is no microstructuring which can interfere with cryoelectronic use.

EXAMPLE 2

Pure Oxygen, No Ultraviolet Radiation

In the absence of ultraviolet radiation but under essentially the same conditions as in Example 1, two layers were formed on a substrate temperature of 670° C. The $YBa_2Cu_3O_7$ layer on $SrTiO_3$ has a broader transition curve of the resistance characteristic to superconductivity. The resistance does not terminate at 81K as is apparent from the characteristic shown in FIG. 3 but only at around 70 to 75K, thereby demonstrating the positive effect of the ultraviolet radiation.

EXAMPLE 3

Gas Mixture with Ultraviolet Light

Layers of $YBa_2Cu_3O_7$ on $SrTiO_3$ are produced at three substrate temperatures utilizing a gas mixture of 90% oxygen and 10% argon. Otherwise the conditions of Example 1 are used.

Figure 5:
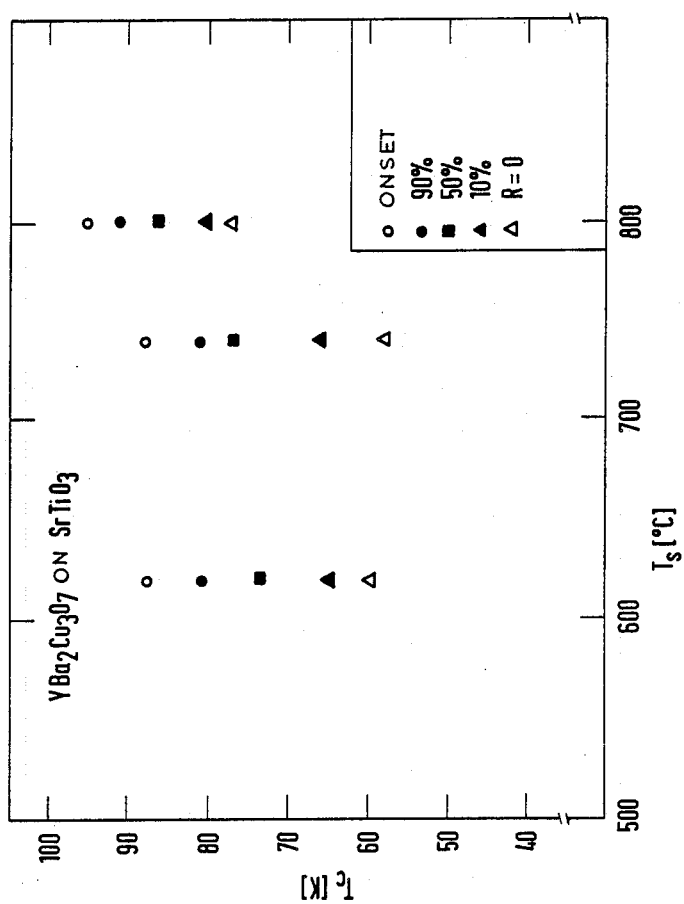
FIG. 5 is a view similar to FIG. 4 illustrating the plotted points for a series of tests in which the gas mixture is a mixture of oxygen and argon.

From the resistance characteristic seen in FIG. 5, it will be apparent that the transition region to superconductivity is broadened by comparison with that of FIG. 4. This shows that the introduction of argon, which may be associated with the incorporation of argon in the layers, has a negative effect on the development of superconductive characteristics.

EXAMPLE 4

Pure Oxygen with Ultraviolet Light

Three layers of the $YBa_2Cu_3O_7$ superconductor of a substrate of oxidized silicon were produced at substrate temperatures around 560° C. The conditions ctherwise were the same as those of Example 1.

Figure 6:
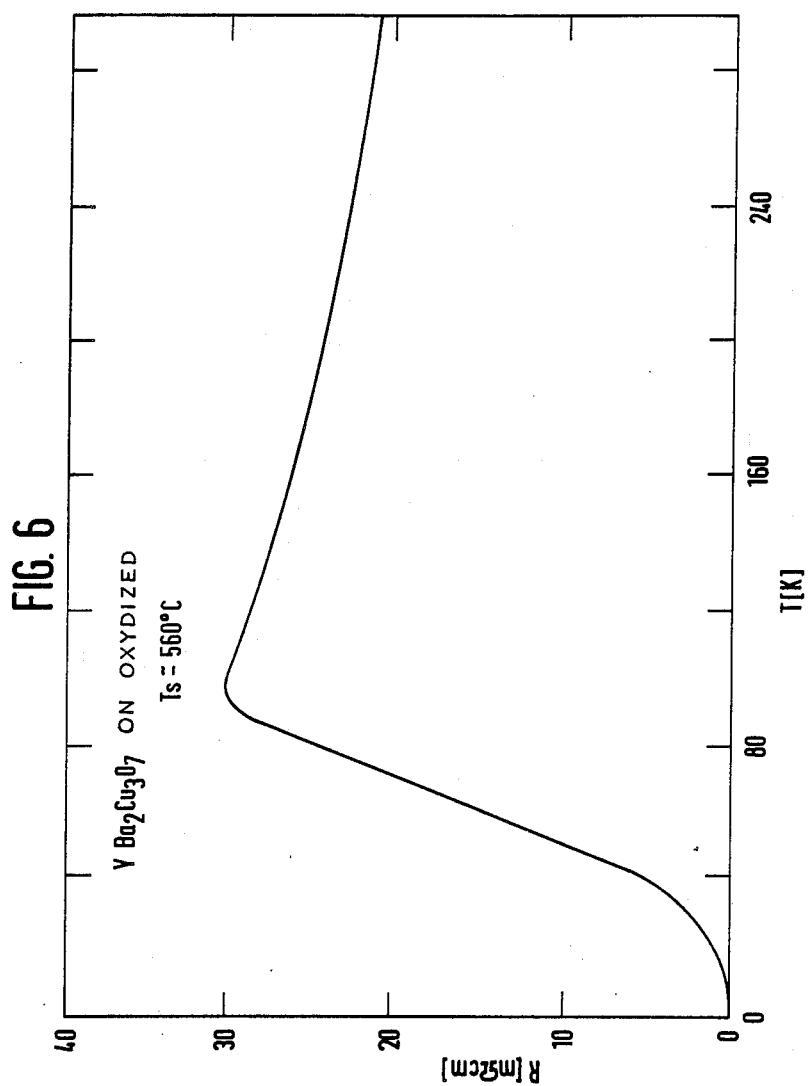
FIG. 6 is a plot of the resistance characteristic of a layer made by the method of Example 4.

FIG. 6 shows the resistance characteristic of the $YBa_2Cu_3O_7$ layer. The transition to superconductivity is indeed quite broad. Although a high critical temperature at around 90K is ensured when the sputtering process is optimized by, for example, varying the target composition to improve the superconductive characteristics, the use of silicon as a substrate permits the product to be utilized both for its superconductivity and conventional semiconductor properties in the fabrication of appropriate electronic devices.

We claim:

1. A method of making a thin-layer superconductor body, comprising the steps of:
   (a) heating a substrate;
   (b) juxtaposing a cathodically poled target composed of a high-transition-temperature oxide with a critical temperature greater than 77 degrees K superconductor with said substrate;
   (c) providing an atmosphere ionized by glow discharge around said substrate and said target;
   (d) effecting cathodic atomization of said target and deposition of cathodically atomized material from said target onto the heated substrate in the presence of said atmosphere to form a thin-layer superconductor body on said substrate; and
   (e) maintaining a partial pressure of oxygen in said atmoshphere of at least 67 Pa and sustaining reactive cathodic deposition of said high-temperature oxide superconductor on said substrate.

2. The method defined in claim 1 wherein said atmoshphere is pure oxygen.

3. The method defined in claim 1, further comprising the step of flushing said substrate with oxygen or ozone to increase the oyygen partial pressure at said substrate during the deposition of said material on said substrate.

4. The method defined in claim 1, further comprising the steps of supplying oxygen or ozone at said target and evacuating gas in the region of said substrate so as to generate a substantially laminar flow of the oxygen or ozone from said target to said substrate to increase the oxygen partial pessure and the deposition rate at said substrate during the deposition of said material on said substrate.

5. The method defined in claim 1, further comprising the step of introducing ionizing radiation into a gas space defined between said target and said substrate.

6. The method defined in claim 5 wherein microwave radiation is introduced into said gas spaced.

7. The method defined in claim 1, further comprising the step of exposing a surface of said substrate adapted to receive a deposit of said material with ultraviolet radiation.

8. An apparatus for making a thin-layer superconductor body, comprising:
a support for a substrate;
means for heating said substrate;
a cathodically poled target composed of a high-transition-temperature oxide superconductor with a critical temperature greater than 77 degrees K juxtaposed with said support and spaced therefrom so that a distance of 5 to 20 mm is maintained between said target and said substrate;
means for providing an atmosphere ionized by glow discharge around said substrate and said target;
means for effecting cathodic atomization of said target and depostion of cathodically atomized material from said target onto the heated substrate in the presence of said atmosphere to form a thin-layer superconductor body on said substrate; and
means for maintaining a partial pressure of oxygen of at least 67 Pa in said atmosphere sustaining reactive cathodic deposition of said high-temperature oxide superconductor on said substrate.

9. The apparatus defined in claim 8, further comprising:
a shield surrounding said cathodically poled target; and
an insulator interposed between said shield and said target.

10. The apparatus defined in claim 9, further comprising means for introducing ionizing radiation into a gas space defined between said target and said substrate.

11. The apparatus defined in claim 10 wherein said means for introducing ionizing radiation into a gas space defined between said target and said substrate is a source of microwaves.

12. The apparatus defined in claim 9, further comprising means for irradiating a surface of said substrate with hard ultraviolet radiation.

13. The apparatus defined in claim 9, further comprising means for flushing a surface of said substrate with a gas.

14. The apparatus defined in claim 13, further comprising means for irradiating said surface of said substrate with hard ultraviolet radiation.

15. The apparatus defined in claim 14, further comprising means for introducing ionizing radiation into a gas space defined between said target and said substrate.

16. The apparatus defined in claim 15, wherein said means for introducing ionizing radiation into a gas space defined between said target and said substrate is a source of microwaves.

* * * * *